United States Patent
Jang et al.

[11] Patent Number: 5,951,773
[45] Date of Patent: Sep. 14, 1999

[54] INDUCTIVELY COUPLED PLASMA CHEMICAL VAPOR DEPOSITION APPARATUS

[75] Inventors: Jin Jang; Jae-gak Kim; Se-Il Ok, all of Seoul, Rep. of Korea

[73] Assignee: Hyundai Electronics Industries Co., Ltd., Kyoungki-do, Rep. of Korea

[21] Appl. No.: 08/819,871

[22] Filed: Mar. 18, 1997

[30] Foreign Application Priority Data

Mar. 18, 1996 [KR] Rep. of Korea .................. 96-7201
Jun. 13, 1996 [KR] Rep. of Korea .................. 96-21113

[51] Int. Cl.$^6$ ........................................... C23C 16/00
[52] U.S. Cl. .............. 118/723 R; 156/345; 198/723 I
[58] Field of Search ............ 156/345; 118/723 R, 118/723 I, 723 IR, 723 AN; 315/111.21, 111.51

[56] References Cited

U.S. PATENT DOCUMENTS

| | | | |
|---|---|---|---|
| 4,419,332 | 12/1983 | von der Ropp | 422/245 |
| 5,498,292 | 3/1996 | Ozaki | 118/724 |
| 5,525,159 | 6/1996 | Hama et al. | 118/723 I |

FOREIGN PATENT DOCUMENTS

| | | |
|---|---|---|
| 0379828 | 8/1990 | European Pat. Off. . |
| 0421348 | 10/1990 | European Pat. Off. . |
| 0520519 | 12/1992 | European Pat. Off. . |
| 0552490 | 7/1993 | European Pat. Off. . |
| 0601468 | 6/1994 | European Pat. Off. . |
| 8260154 | of 0000 | Japan . |

OTHER PUBLICATIONS

"Electrostatic Coupling of Antenna and the Shielding Effect in Inductive RF Plasmas", H. Sugai et al, *Jpn. Journal of Appl. Phys.*, vol. 23 (1994), pp. 2189–2193. Part 1, No. 4B, Apr. 1994.

"High Rate and Highly Selective SiO$_2$ Etching Employing Inductively Coupled Plasma and Discussion on Reaction Kinetics", Y. Horike et al, *Journal Vac. Sci. Technol.* A 13(3) May/Jun. 1995, pp. 801–809.

"Characterization at Different Aspect Ratios (Radius/Length) of a Radio Frequency Inductively Coupled Plasma Source", P. Wainman et al, *Journal Vac. Sci. Technol.*, A 13(5), Sep./Oct. 1995, pp. 2464–2469.

Deposition of Hydrogenated Amorphous Silicon by an Inductively Coupled Glow Discharge Reactor with Shield Electrodes, K. Yokota et al, *Journal of Applied Physics*, vol. 72, No. 3, Aug. 1, 1992, pp. 1188–1190.

Structural Properties of Polycrystalline Silicon Films Prepared at Low Temperatures by Plasma Chemical Vapor Deposition, H, Kakinuma et al, *J. Appl. Phys.*, vol. 70, No. 12, Dec. 15, 1991, pp. 7374–7381.

*Primary Examiner*—Bruce Breneman
*Assistant Examiner*—Luz Alejandro
*Attorney, Agent, or Firm*—Ware, Fressola, Van Der Sluys & Adolphson LLP

[57] ABSTRACT

Disclosed is an inductively coupled plasma chemical vapor deposition apparatus including: a vacuum reaction chamber having an interior, bounded in part by a dielectric shield, the dielectric shield being lined with an oxygen-less silicon layer formed on its interior surface; a gas introducing unit for introducing a reactant gas to the interior of the vacuum reaction chamber; an antenna where radio frequency power is applied, the antenna being arranged outside the vacuum reaction chamber and adjacent to the dielectric shield; a coupling unit for coupling a radio frequency power source to the antenna; a stage for heating a work piece to be processed within the interior of the vacuum reaction chamber; and an exhaust unit for exhausting remnant gases from the interior of the vacuum reaction chamber. The oxygen-less silicon layer can be either an amorphous silicon layer, silicon nitride layer or silicon carbide layer.

5 Claims, 5 Drawing Sheets

INDUCTIVELY COUPLED PLASMA CHEMICAL VAPOR DEPOSITION APPARATUS

BACKGROUND OF THE INVENTION

1. Field of Invention

The present invention relates to an apparatus for inductively coupled plasma chemical vapor deposition (ICP CVD), and more particularly to an ICP CVD apparatus for preventing pollution of impurities from a dielectric shield constituting, in part, a reaction chamber.

2. Related Art

The laid-opened publication of Japanese Patent Application (No. 95-60704) discloses an ICP CVD apparatus capable of forming a thin film. The above ICP CVD apparatus includes: a ring shaped antenna where a radio frequency (RF) power is applied; a dielectric shield disposed adjacent to the antenna; a chamber having the dielectric shield, capable of maintaining an air-tight seal; a stage disposed within the chamber for heating a work piece to be processed; a gas supply unit for supplying at least two or more reactant gases in predetermined quantities to the chamber; and an exhaust unit for exhausting the remnant gases inside the chamber.

The above ICP CVD apparatus operates as follows. If, radio frequency power is applied to the ring shaped antenna, plasma is induced on the opposite side of the dielectric shield, that is, the inside of the chamber. The dielectric shield is made of quartz and is disposed adjacent to the antenna. The stage is arranged in the inside of the chamber, and the work piece, that is loaded onto the stage, is heated. The exhaust unit exhausts the remnant gases inside the chamber, leaving a vacuum. The gas supply unit then supplies at least two or more gases in predetermined quantities to the chamber.

In the ICP CVD apparatus, however, the dielectric shield is made of material containing oxygen, such as quartz. Accordingly, there is a disadvantage in that oxygen or impurities dissociate from the dielectric shield to adversely affect film quality.

Furthermore, in the above ICP CVD apparatus, because an inlet port of the gas supply unit is disposed at the side portion and not the central portion of the vacuum reaction chamber, the gas is not uniformly spread over a large area so that an uniform plasma of high density is not induced.

SUMMARY OF THE INVENTION

The object of the invention is to provide an ICP CVD apparatus capable of fabricating a thin film of high quality by preventing the dissociation of oxygen or impurities from a dielectric shield of the ICP CVD apparatus.

The above object is accomplished by depositing a silicon absent of oxygen on the surface of a dielectric shield constituting, in part, a vacuum reaction chamber of an ICP CVD apparatus.

An ICP CVD apparatus according the present invention includes: a vacuum reaction chamber having an interior, bounded, in part by a dielectric shield, the dielectric shield being lined with an oxygen-less silicon layer formed on its interior surface; a gas introducing unit for introducing a process gas to the interior of the vacuum reaction chamber; an antenna where radio frequency power is applied, the antenna being arranged outside the vacuum reaction chamber and adjacent to the dielectric shield; a coupling unit for coupling a radio frequency power source to the antenna; a stage for heating a work piece to be processed within the interior of the vacuum reaction chamber; and an exhaust unit for exhausting remnant gases from the interior of the vacuum reaction chamber.

Preferably, the oxygen-less silicon layer is an amorphous silicon layer, a silicon nitride layer, or a silicon carbide layer. The gas introducing unit for introducing a reactant gas may supply at least two or more reactant gases in a predetermined quantities to the vacuum reaction chamber. Furthermore, the antenna is preferably a spiral-shaped antenna to obtain a plasma density of $1\times10^{11}$–$1\times10^{12}$ cm$^{-3}$.

In the fabrication of a TFT-LCD including an amorphous silicon layer and silicon nitride layer, using the ICP CVD apparatus of the present invention, the obtained amorphous silicon layer is found to have excellent electrical and optical properties in the areas of photo sensitivity, conductivity, activation energy, and optical band gap. Furthermore, the uniform amorphous silicon layer has excellent properties in the areas of field effect mobility and threshold voltage. In addition, an uniform silicon nitride layer is obtained having excellent film properties in the areas of conductivity, breakdown voltage, and current density. Accordingly, using the ICP CVD apparatus of the present invention, a TFT-LCD of high quality is fabricated.

BRIEF DESCRIPTION OF THE DRAWINGS

The objects and features of the present invention may be better understood with reference to the following detailed description, appended claims, and attached drawings wherein:

DETAILED DESCRIPTION OF THE INVENTION

Figure 1:
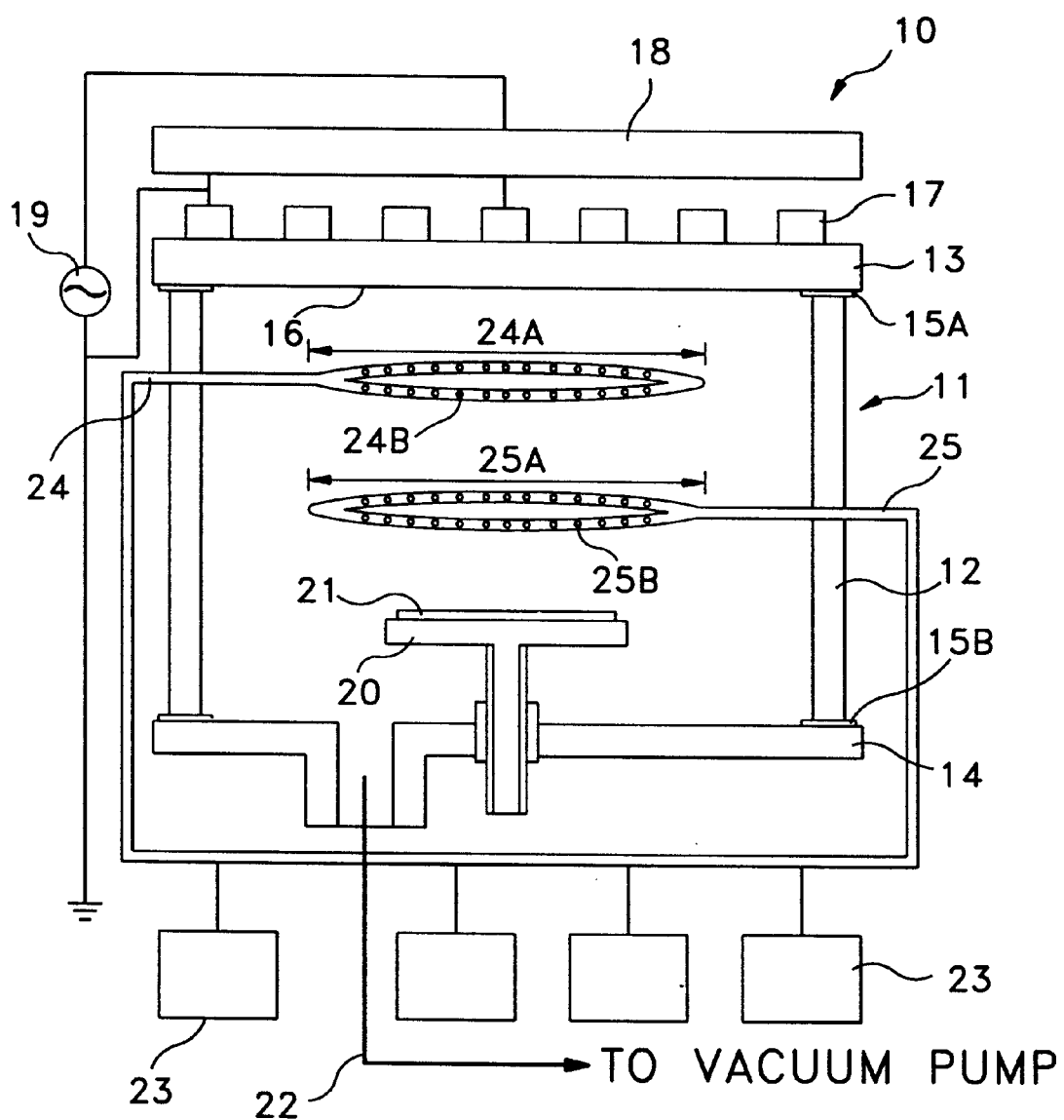
FIG. 1 is a diagram illustrating an ICP CVD apparatus in accordance with one embodiment of the present invention.

FIG. 1 shows an inductively coupled plasma chemical vapor deposition apparatus 10 fabricated according to the present invention. The ICP CVD apparatus includes a vacuum reaction chamber 11. The vacuum reaction chamber 11 is composed of a cylindrical side plate 12, an upper plate 13, and a bottom plate 14. In order to maintain the vacuum reaction chamber 11 in sealed state, there is provided O-shaped ring (hereinbelow referred to as O-ring) seals 15A and 15B between the cylindrical side plate 12 and the upper plate 13, and between the cylindrical side plate 12 and the bottom plate 14, respectively.

The upper plate 13 is a dielectric shield, being made of quartz material. An insulating ceramic material such as $Al_2O_3$ can be applied for use of the upper plate 13 (Hereinafter refered to as dielectric shield 13). $Al_2O_3$ has a property of allowing radio frequency (RF) power to pass through, but at the same time, blocking infrared rays.

In order to prevent the dielectric shield 13 from being etched and releasing oxygen or other impurities into the vacuum reaction chamber 11 during deposition of a selected thin film in the vacuum reaction chamber 11, a silicon layer 16 absent of oxygen is provided on the interior surface of the dielectric shield 13 of the vacuum reaction chamber 11. The silicon layer 16 is composed of amorphous silicon, being about 1,000 Å in thickness. Silicon nitride or silicon carbide can be also used in place of the amorphous silicon. Use of the silicon layer 16 absent of oxygen provides an important feature in the present invention.

An antenna 17 is arranged on the outer surface of the dielectric shield 13. It is preferable that the antenna 17 be of a spiral shape which: facilitates application of RF power to a large area; provides a superior and more uniform distribution of RF power; and is relatively simple in shape.

Figure 2A:
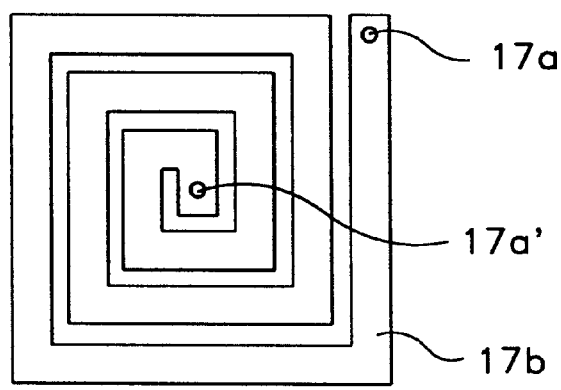
FIG. 2A is a schematic diagram illustrating structure of an antenna used in the ICP CVD apparatus of FIG. 1.
Figure 2B:
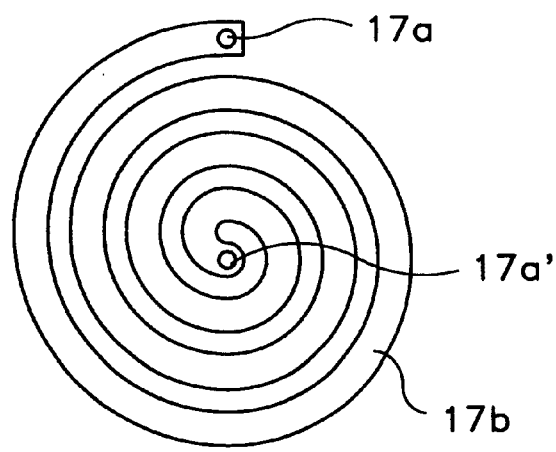
FIG. 2B is a schematic diagram illustrating structure of an alternative antenna used in the ICP CVD apparatus of FIG. 1.

Two kinds of spiral shaped antennas that may be applied in the present invention are represented in FIGS. 2A and 2B, either one can be used with equal preference to obtain a plasma density of $1 \times 10^{11} - 1 \times 10^{12}$ cm$^{-3}$. In drawings, the reference numerals 17a and 17a' designates terminals for applying RF power and 17b designates a coil.

The antenna 17 is also coupled to a matching box 18. The matching box 18 is coupled to a RF source 19.

A stage 20 is arranged in a central portion of the bottom plate 14. A work piece such as glass substrate 21 is mounted on the stage 20. An outlet line 22 for exhausting gases from the vacuum reaction chamber 11 is provided at a predetermined position of the bottom plate 14. The stage 20 is insulated from the bottom plate 14, and is designed to have a cooling and heating capability necessary for plasma deposition.

Reactant gases are supplied into the vacuum reaction chamber 11 by one or more gas supply tubes. The present embodiment shows use of two gas supply tubes 24 and 25. A plurality of gas storage tanks 23 are coupled to the gas supply tubes 24 and 25, in order to supply two or more reactant gases.

The gas supply tubes 24 and 25 includes ring-shaped parts 24A and 25A, which are formed to be positioned at central portion of the vacuum reaction chamber 11 and above the stage 20, to make supply area of reactant gases wide and uniform. At predetermined portions of the respective ring-shaped parts 24A and 25A, there are provided a plurality of nozzles 24B and 25B separated by a constant intervals along the periphery.

In the deposition of a film, RF power is applied to the spiral-shaped antenna 17 and preselected reactant gases are supplied from the gas storage tanks 23 to the gas supply tubes 24 and 25. Afterwards, the supplied gases in the gas supply tubes 24 and 25 are introduced into the vacuum reaction chamber 11 through the plurality of nozzles 24B and 25B of the ring-shaped parts 24A and 25A, resulting in formation of inductively coupled plasma having a high peak ion density of $1 \times 10^{11} - 1 \times 10^{12}$ cm$^{-3}$.

In the present embodiment, a silicon source gas such as $SiH_4$, $Si_2H_6$, $SiH_2Cl_2$, and the like, is used for forming a thin amorphous silicon film formed from inductively coupled plasma, while a silicon nitride source such as $SiH_4/N_2$, $SiH_4/NH_3$, $SiH_2Cl_2/NH_2/H_2$, and the like, is used for forming a silicon nitride film.

Hereinbelow, various properties for thin films fabricated by inductively coupled plasma CVD apparatus according to the present embodiment, are described.

Figure 3:
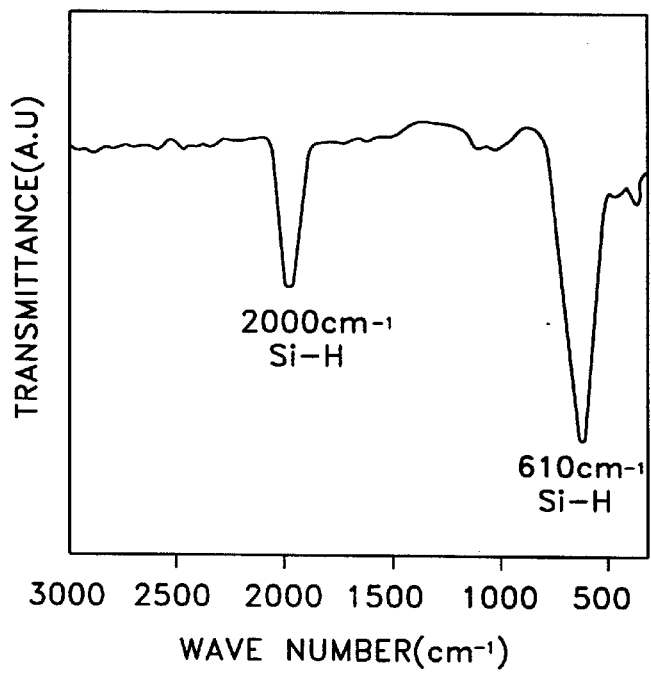
FIG. 3 is a graph illustrating Fourier transform infrared (FT-IR) property of an amorphous silicon layer deposited with the ICP CVD apparatus according to one embodiment of the present invention.

FIG. 3 shows FT-IR (fourier transform infrared) property of thin amorphous silicon film fabricated according to the present embodiment. Herein, transmittance in an infrared ray region is measured for a specimen wherein thin amorphous silicon film is deposited on single crystalline silicon substrate. The apparatus for measurement as used is FT-IR spectroscopy device made by the BOMEN company, the model name being BOMEN 100. The measured spectrum results at infrared ray region show that stretch mode of the Si—H bond at a wave number of 2,000 cm$^{-1}$ and bend mode of the Si—H bond at a wave number 610 cm$^{-1}$ come in. From the above result, the film formed in the present embodiment is determined to be a typical thin amorphous silicon film. Meanwhile, Si—$H_2$ bond is not shown in the film formed by this embodiment. Hydrogen content from Si—H bond is 14 at % as calculated.

Figure 4:
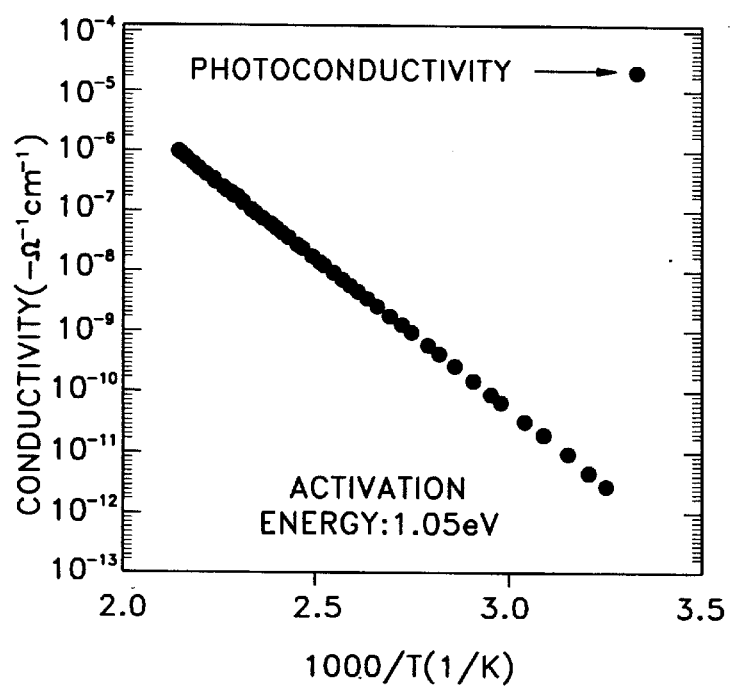
FIG. 4 is a graph illustrating conductivity of an amorphous silicon layer with the ICP CVD apparatus according to one embodiment of the present invention.

FIG. 4 is a graph showing conductivity in amorphous silicon film, the film being formed by inductively coupled plasma apparatus fabricated according to the embodiment of the present invention. Herein, Corning 7059 is used as the substrate. On the substrate, there is provided the amorphous silicon film formed from the above method. On the amorphous silicon film, there are provided aluminum electrode films formed in the coplanar structure by thermal deposition method. Thereafter, the substrate is loaded to fixed position on the stage 20 of the inductively coupled plasma CVD apparatus in FIG. 1. Afterwards, conductivity as a function of temperature is measured using a Keithley electrometer 617 and a Keithley multimeter 195A. From the measurement result, dark conductivity at room temperature and photoconductivity at a condition of AM-1 are respectively calculated, the former being $4.3 \times 10^{-12}$ $\Omega^-$cm$^{-1}$ and the latter $1.4 \times 10^{-5}$ $\Omega^{-1}$cm$^{-1}$. The condition of AM-1 is one where light radiates the specimen at 100 mW/cm$^2$. In addition, activation energy is obtained from the slope of graph of FIG. 4. The obtained activation power is thus determined to be 1.05 eV. Photosensitivity of the thin amorphous silicon film deposited, is $3 \times 10^{-6}$ so that the thin amorphous silicon film obtained, according the present invention, is determined to have superior physical properties.

Figure 5:
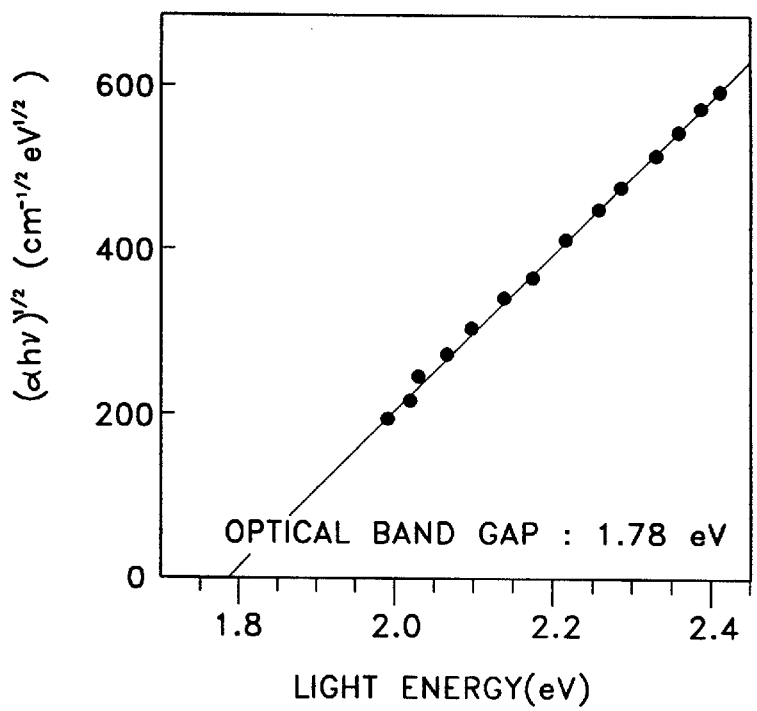
FIG. 5 is a graph illustrating optical band gap property of an amorphous silicon layer deposited with the ICP CVD apparatus according to one embodiment of the present invention.

FIG. 5 is a graph showing optical band gap in a thin amorphous silicon film formed by inductively coupled plasma CVD apparatus according to the present invention. Optical absorption coefficient α for thin amorphous silicon film deposited on the glass substrate of Corning 7059 is measured using UV/VIS spectrometer. Using the optical absorption coefficient, optical band gap is obtained from the following equation:

$$(\alpha h\nu)^{1/2} = B(E - E_g^{opt})$$

wherein: B is a constant that means a slope of the band; hν is a incident photon power; α is optical absorption coefficient, and $E_g^{opt}$ is optical band gap.

As shown in FIG. 5, optical band gap is 1.78 eV, and the value indicates that the formed thin amorphous silicon film is typical.

Figure 6:
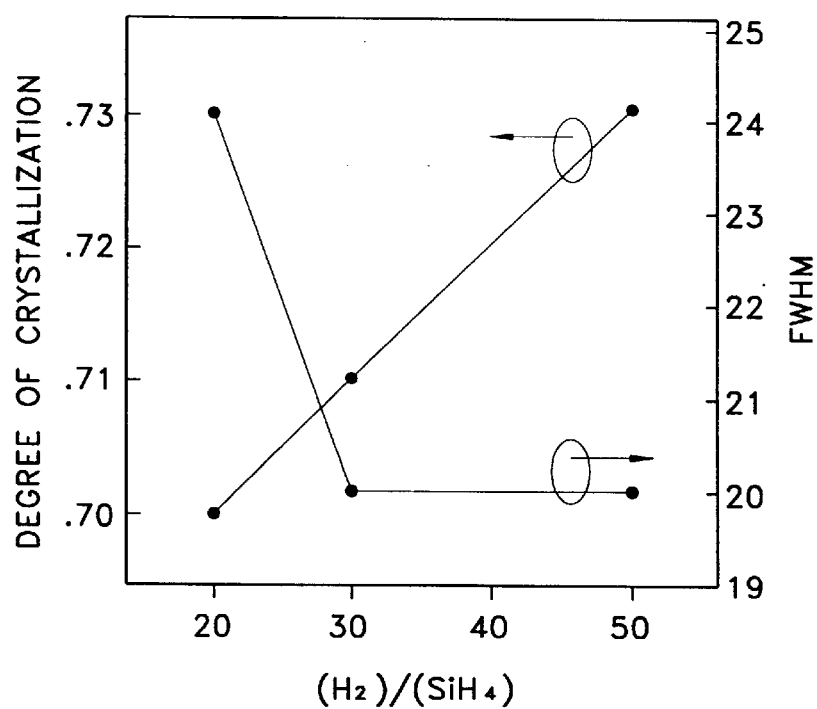
FIG. 6 is a graph showing degree of crystallization and full-width at half maximum (FWHM) which are obtained from Raman scattering of thin microcrystalline silicon film according to one embodiment of the present invention.

FIG. 6 is a graph showing degree of crystallization and full-width at half maximum (FWHM) which are obtained from Raman scattering of thin microcrystalline silicon film, the film being deposited according to the ratio of $H_2/SiH_4$ in inductively coupled plasma CVD apparatus of the present invention.

There is provided a specimen wherein thin microcrystalline silicon film is deposited on a glass substrate of Corning 7059. Degree of crystallization and FWHM of microcrystalline silicon film formed, are determined using Raman spectroscopy (refer to H. Kakinuma et al., Jpn. J. Appl. Phys. 70, 7374, 1991). Grain size of the microcrystalline silicon film formed, is 200–400 Å, and degree of crystallization is 70–73% as shown in FIG. 6. In considering that typical microcrystalline silicon film has a grain size of 30–200 Å and degree of crystallization ranges from 2% to 70%, the grain size and the degree of crystallization as obtained in the present invention indicates that the formed microcrystalline silicon film has superior physical properties.

Figure 7:
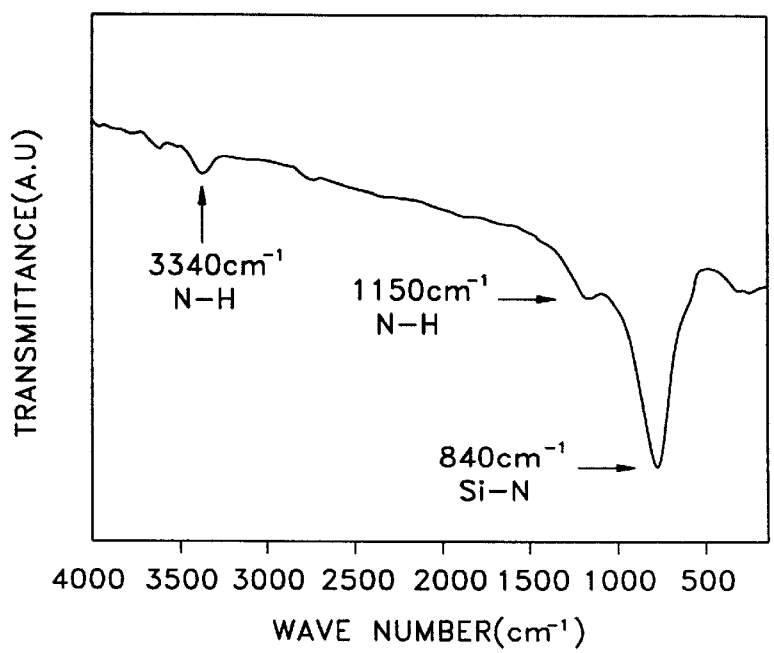
FIG. 7 is a graph illustrating FT-IR property of a silicon nitride layer deposited using the ICP CVD apparatus according to one embodiment of the present invention.

FIG. 7 shows FT-IR property of thin silicon nitride film. Herein, transmittance at infrared ray region is measured for a specimen wherein thin nitride silicon film is deposited on single crystalline silicon substrate. Apparatus for measurement as used is a FT-IR spectroscopy device made by BOMEN company. The measured spectrum results at infrared ray region show a stretch mode of N—H bond at a wave number of 3,340 $cm^{-1}$ and a bend mode of N—H bond at wave number 1,150 $cm^{-1}$. In addition, wagging mode of the Si—N bond is shown at a wave number of 840 $cm^{-1}$(refer to Plasma Deposited Thin Films pressed by CRC, p35, J. Mort and F. Jansen) From the above results, the film formed in the present embodiment is determined to be a typical thin silicon nitride film (refer to P. Paduschek et. al., Thin Solid Films, 110, 291, 1983).

Figure 8:
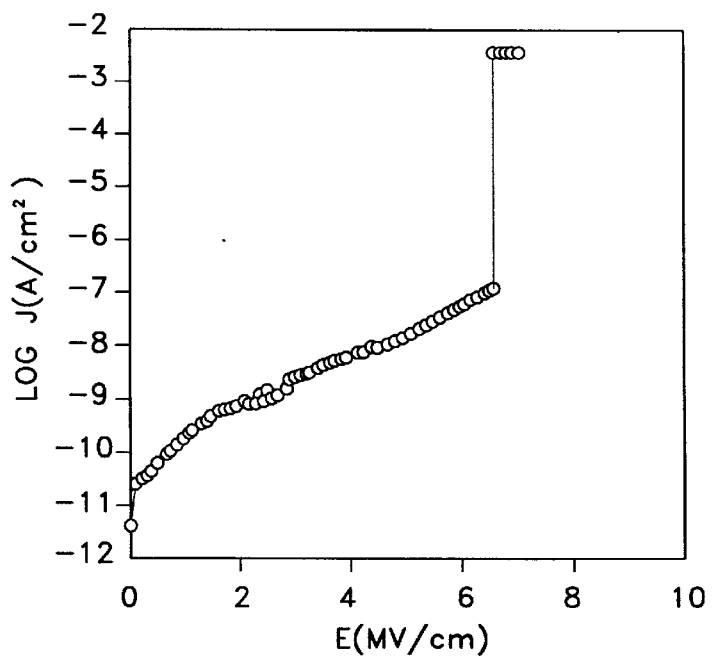
FIG. 8 is a graph illustrating voltage-current characteristic of a silicon nitride layer deposited using the ICP CVD apparatus according to one embodiment of the present invention.

FIG. 8 is a graph showing current-voltage property of a thin silicon nitride film formed in inductively coupled plasma CVD apparatus of the present invention.

After the thin silicon nitride film with thickness of approximate 1,000 Å is deposited on p-typed single crystalline silicon substrate having a resistivity of 10–15 Ωcm, aluminum layer with diameter of 1 mm is formed on the thin silicon nitride film in vacuum by thermal deposition method. Through the above processes, a specimen for use in testing of current-voltage property with MIS structure is fabricated. Current-voltage characteristic of the specimen is measured using Keithley electrometer 617. From the measurement, as shown in FIG. 8, breakdown voltage is 7 MV, and current density is $10^{-10}$ $A/cm^2$ at 1 MV/cm.

As described in the present embodiments, inductively coupled plasma CVD apparatus according to the present invention can obtain uniform plasma with high density from the reaction chamber, since the apparatus has silicon layer absent of oxygen, the silicon layer being formed on dielectric shield. In addition, ring-shaped parts connected to gas supply means, are arranged such that it is positioned at a central portion of the reaction chamber above the stage, the ring-shaped parts having a plurality of gas supply nozzles formed at its periphery at constant intervals. Accordingly, the present invention can provide a thin amorphous silicon film having superior properties in areas such as photosensitivity, conductivity, activation power, and optical band gap wherein thickness is uniform throughout its surface. There is also provided a thin silicon nitride film having superior properties in areas such as breakdown voltage and current density wherein thickness is uniform throughout its surface. Moreover, there is provided a thin microcrystalline silicon film wherein grain size is very small and thickness is uniform throughout its surface. Furthermore, the present invention can provide a thin film transistor including a thin amorphous silicon film, having superior electrical properties in areas of field effect mobility and threshold voltage so that it is possible to fabricate a high quality of thin film transistor liquid crystal display(TFT-LCD).

It will be apparent to those skilled in the art that various modifications and variations can be made in inductively coupled plasma chemical vapor deposition apparatus of the present invention without departing from the spirit or scope of the invention. Thus, it is intended that the present invention covers the modifications and variations of this invention provided they come within the scope of the appended claims and their equivalents.

What is claimed is:

1. An inductively coupled plasma chemical vapor deposition apparatus, comprising:

a vacuum reaction chamber having an interior bounded in part by a dielectric shield, said dielectric shield being lined with an oxygen-less amorphous silicon layer formed on its interior surface;

means for introducing a reactant gas to the interior of said vacuum reaction chamber;

an antenna to which radio frequency power is applied, said antenna being arranged outside said vacuum reaction chamber and adjacent to said dielectric shield;

means for coupling a radio frequency power source to said antenna;

a stage for heating a work piece to be processed within said interior of said vacuum reaction chamber; and an exhaust means for exhausting a remnant gas from the interior of the vacuum reaction chamber.

2. The apparatus as claimed in claim 1, wherein said means for introducing a reactant gas supplies two or more reactant gases in selected quantities, and includes a ring-shaped part for the purpose of uniform gas distribution, arranged in a central portion of said vacuum reaction chamber.

3. The apparatus as claimed in claim 2, wherein a plurality of nozzles is formed at regular intervals on the periphery of said ring-shaped part of said means for introducing a reactant gas.

4. The apparatus as claimed in claim 3, wherein said antenna is a spiral-shaped antenna.

5. The apparatus as claimed in claim 2, wherein said antenna is a spiral-shaped antenna.

* * * * *

UNITED STATES PATENT AND TRADEMARK OFFICE
CERTIFICATE OF CORRECTION

PATENT NO : 5,951,773
DATED : September 14, 1999
INVENTOR(S): Jang et al

It is certified that error appears in the above-identified patent and that said Letters Patent is hereby corrected as shown below:

On the cover page, Item [75], please cancel "Se-Il Ok" and substitute --Se-Il Cho--.

At col. 1, line 26, please delete the comma after "If".

At col. 3, line 12, please cancel "Al$_2$O$_3$" and substitute --Al$_2$O$_3$-- therefor.

At col. 4, line 9, please cancel "SiH$_2$Cl$_2$/NH$_2$/H$_2$" and substitute --SiH$_2$Cl$_2$/NH$_3$/H$_2$-- therefor;

at line 29, please insert a period prior to "%"; and at line 45, please cancel "$\Omega^-$cm$^{-1}$" and substitute --$\Omega^{-1}$cm$^{-1}$-- therefor.

Signed and Sealed this

Twenty-fifth Day of April, 2000

Attest:

Q. TODD DICKINSON

*Attesting Officer*  *Director of Patents and Trademarks*